United States Patent
Rho et al.

[11] Patent Number: 5,904,541
[45] Date of Patent: *May 18, 1999

[54] METHOD FOR FABRICATING A SEMICONDUCTOR DEVICE HAVING A SHALLOW TRENCH ISOLATION STRUCTURE

[75] Inventors: Kwang Myoung Rho; Seong Min Hwang, both of Kyoungkido, Rep. of Korea

[73] Assignee: Hyundai Electronics Industries Co., LTD., Kyoungkido, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/879,806

[22] Filed: Jun. 20, 1997

[30] Foreign Application Priority Data

Jun. 27, 1996 [KR] Rep. of Korea .................. 96/24660

[51] Int. Cl.⁶ ................................................. H01L 21/76
[52] U.S. Cl. ......................... 438/433; 438/434; 438/435; 438/524; 438/525; 148/DIG. 50
[58] Field of Search .................................... 438/427, 433, 438/434, 435, 524, 525; 148/DIG. 50

[56] References Cited

U.S. PATENT DOCUMENTS

| | | |
|---|---|---|
| 4,472,240 | 9/1984 | Kameyama . |
| 4,580,330 | 4/1986 | Pollack et al. .................. 148/DIG. 50 |
| 5,401,998 | 3/1995 | Chiu et al. . |
| 5,436,190 | 7/1995 | Yang et al. . |

FOREIGN PATENT DOCUMENTS

| | | |
|---|---|---|
| 0405923 A2 | 1/1991 | European Pat. Off. . |
| 57-107037 | 7/1982 | Japan . |
| 58-3242 | 1/1983 | Japan . |
| 58-32430 | 2/1983 | Japan . |

*Primary Examiner*—Trung Dang
*Attorney, Agent, or Firm*—Jacobson, Price, Holman & Stern, PLLC

[57] ABSTRACT

A semiconductor device having a shallow trench isolation structure, where the upper part of the trench is broader than the lower part of it, comprises an insulating layer on the sidewalls of the upper part of the trench, another insulating layer buried in the trench for isolating semiconductor devices and low-concentration doped regions near the upper part of the trench and high-concentration doped regions near the lower part of the trench. Therefore, the leakage current is prevented due to the sufficient amount of the ions in the high-concentration doped regions near the lower part of the trench and the narrow width effect is minimized owing to the insulating layer on the sidewalls of the upper part of the trench.

14 Claims, 6 Drawing Sheets

METHOD FOR FABRICATING A SEMICONDUCTOR DEVICE HAVING A SHALLOW TRENCH ISOLATION STRUCTURE

BACKGROUND OF THE INVENTION

1. Field of the Invention

This invention relates to a semiconductor device, and more particularly to a semiconductor device having a shallow trench isolation structure removing the narrow width effect and a method for fabricating the same.

2. Description of the Prior Art

The local oxidation of silicon process (LOCOS) and the recessed local oxidation of silicon process (RLOCOS) have been used for the isolation technique of semiconductor devices. In the local oxidation method, the shape of the field oxide layer at the an oxidation mask edges is that of a slowly tapering oxide wedge that merges into the pad oxide layer, which is disposed between a silicon substrate and the oxidation mask, it has been referred to as a bird's beak. The bird's beak is a lateral extension of the filed oxide layer into the active area, whereby the active area is reduced.

As the integration of semiconductor devices are increased, it is very important to obtain the correct active area, therefore the shallow trench isolation (STI) technique capable of removing the bird's beak is highlighted.

The FIGS. 1A to 1D, are cross sectional views of a semiconductor device having a shallow trench isolation structure according to a conventional method.

First, referring to FIG. 1A, a silicon oxide layer 2 and a silicon nitride layer 3 are formed, in order, on a silicon substrate 1, and photoresist patterns 4 are formed on the silicon nitride layer 3. Thereafter, the silicon nitride layer 3, the silicon oxide layer 2 and the silicon substrate 1 are selectively etched to form a trench using photoresist patterns 4 as an etching mask.

Referring to FIG. 1B, photoresist patterns 4 are removed and an oxide layer 5 is formed on the side walls and the bottom of the trench to prevent the silicon substrate 1 from being damaged in the channel stop ion implantation process. Thereafter, ions 6 are implanted into the silicon substrate around the trench so that a channel stop ion implantation layer 7 is formed. In the channel stop ion implantation process, the ions 6 are implanted obliquely into the trench to increase the dopant concentration in the sidewalls of the trench, whereby the depletion phenomenon is prevented.

Referring to FIG. 1C, an insulating layer 8 is formed to isolate devices on the resulting structure, thereby fully filling the trench with the insulating material.

Referring to FIG. 1D, the insulating layer 8 is etched by the chemical-mechanical polishing method, and then a buried insulating layer 8a is formed in the trench.

The dopants in the sidewalls of the trench flow into the buried insulating layer 8a during the thermal treatment process. Therefore the leakage current increases due to the depletion effect.

As a method for solving the above mentioned problem, ions are implanted obliquely into the sidewalls of the trench to increase the dopant concentration in the sidewalls. However, in this case, it is difficult to obtain the concentration uniformity over the sidewalls, and moreover the channel width is reduced by the dopants in the region near the silicon substrate. This is referred to as the narrow width effect of the device.

FIG. 2 shows the dependency of the ion concentration on the depth along the line a-a' in FIG. 1D. The solid line shows the dopant concentration and the dotted line shows the target value of the dopant concentration. As shown in FIG. 2, the dopant concentration is higher than the target values in the region near the silicon substrate surface, but is lower than the target values in the other region.

As mentioned above, the channel stop ion implantation process is carried out to reduce the leakage current, but it may cause the serious problem of the narrow width effect.

SUMMARY OF THE INVENTION

Therefore, the present invention has been made in view of the above mentioned problem, and the object of the present invention is to provide a semiconductor device preventing the narrow width effect caused in the channel stop ion implantation process and a method for fabricating the same.

In accordance with an aspect of the present invention, there is provided a method for fabricating a semiconductor device comprising the steps of: forming a first recess by etching a semiconductor substrate to a predetermined depth; forming first insulating layer patterns on the sidewalls of said first recess, exposing the bottom of said first recess; forming a second recess by etching a region not covered with said first insulating layer patterns in said first recess; forming an ion-doped region in said first and said second recesses by a channel stop ion implantation process; and forming a second insulating layer with which said first and second recesses are fully filled.

In accordance with another aspect of the present invention, there is provided another method for fabricating a semiconductor device having a shallow trench isolation structure including the steps of: forming mask patterns on a semiconductor substrate, exposing a portion of said semiconductor substrate; selectively etching an exposed region of said semiconductor substrate to a predetermined depth so as to form a first recess; forming ion-implantation buffer layers on the sidewalls of said first recess, exposing the bottom of said first recess; etching said semiconductor substrate using said mask patterns and said ion-implantation buffer layers as an etching mask, thereby forming a second recess; implanting ions into said semiconductor substrate around said first and second recesses, wherein the ions are implanted obliquely; and forming an insulating layer on the resulting structure and etching back said insulating layer so that said first and second recesses are fully filled with said insulating layer.

In accordance with further another aspect of the present invention, there is provided a semiconductor device having a shallow trench isolation structure comprising: a semiconductor substrate having a trench, wherein the upper part of said trench is broader than the lower part of said trench; a first insulating layer formed on the sidewalls of said upper part of said trench; a second insulating layer buried in said trench for isolation of said semiconductor devices; low-concentration doped regions formed in said semiconductor device, wherein said low-concentration doped regions are near said upper part of said trench; and high-concentration doped regions formed in said semiconductor device, wherein said high-concentration doped regions are near said lower part of said trench.

BRIEF DESCRIPTION OF THE DRAWINGS

These and other objects, features and advantages of the present invention will be more fully apparent from the description of the preferred embodiments with reference to the accompanying drawings in which.

DETAILED DESCRIPTION OF THE PREFERRED EMBODIMENTS

Figure 1A:
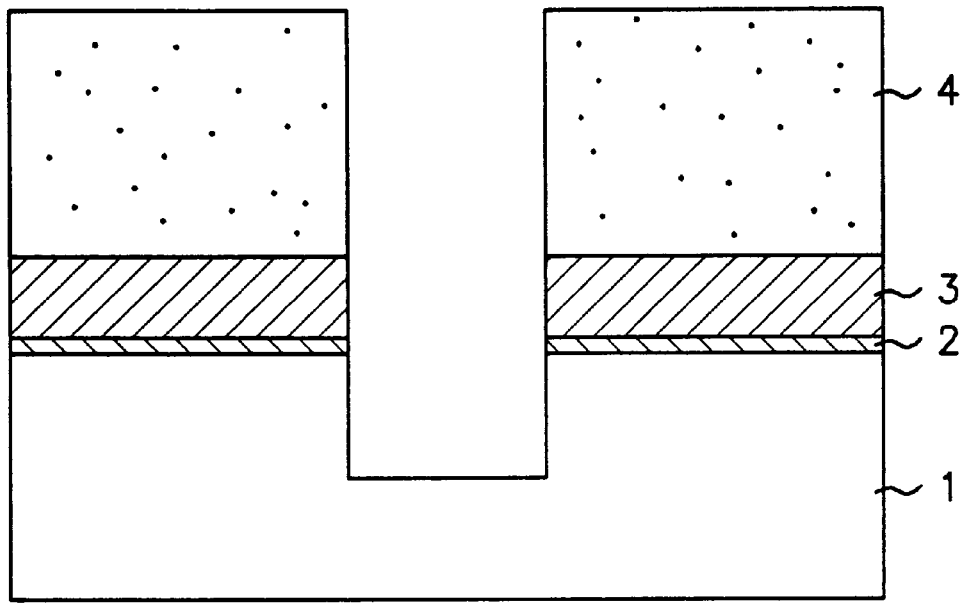
FIGS. 1A to 1D are cross sectional views of a semiconductor device having a shallow trench isolation structure according to a conventional method.
Figure 1B:
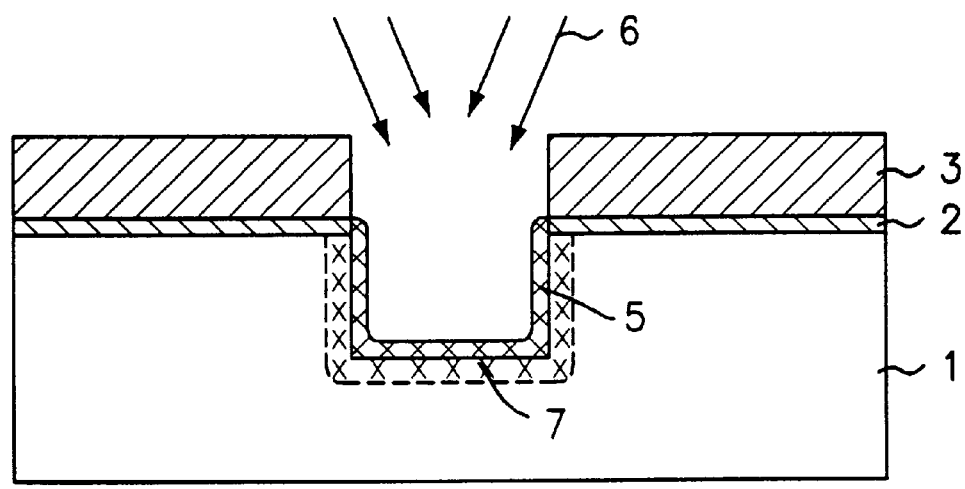
Figure 1C:
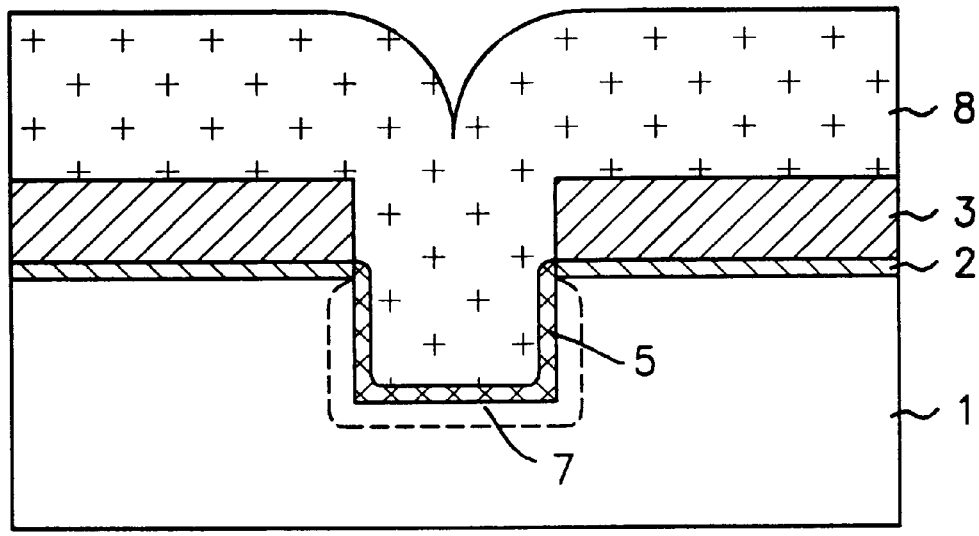
Figure 1D:
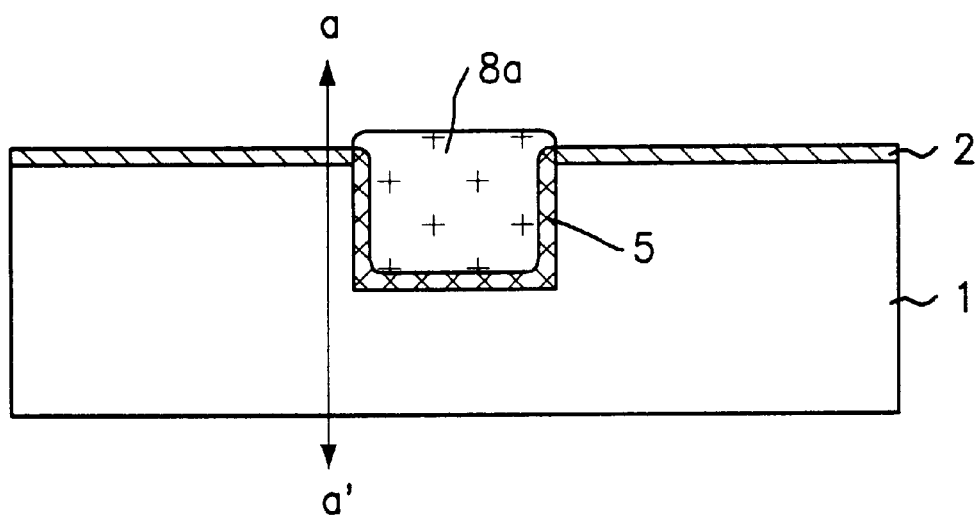
Figure 2:
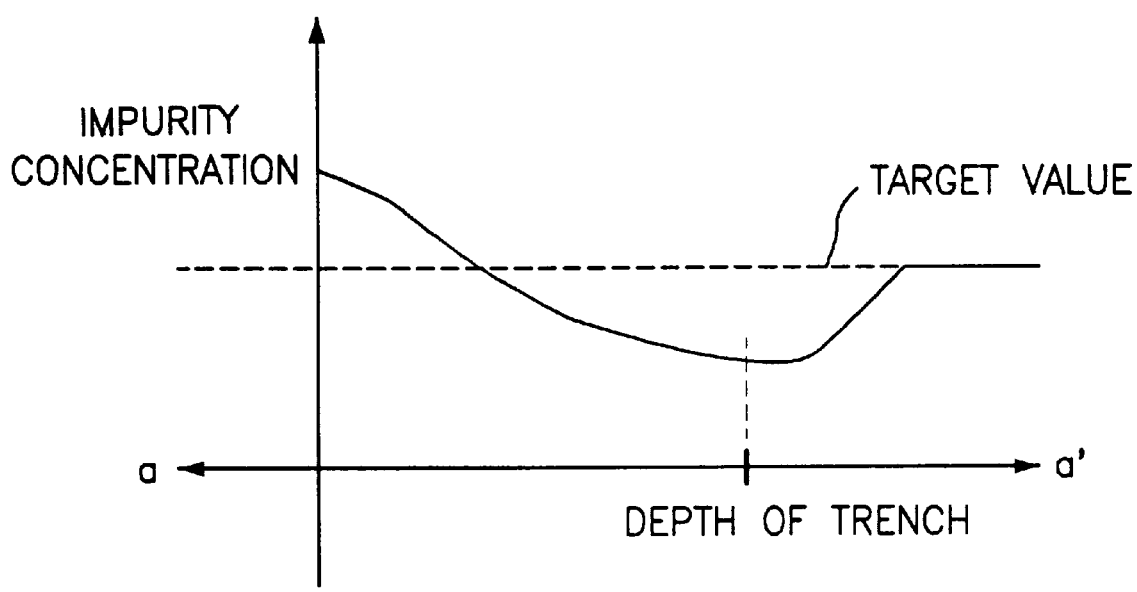
FIG. 2 a plot showing the dependency of the ion concentration on the depth along the line a-a' in FIG. 1D.
Figure 3A:
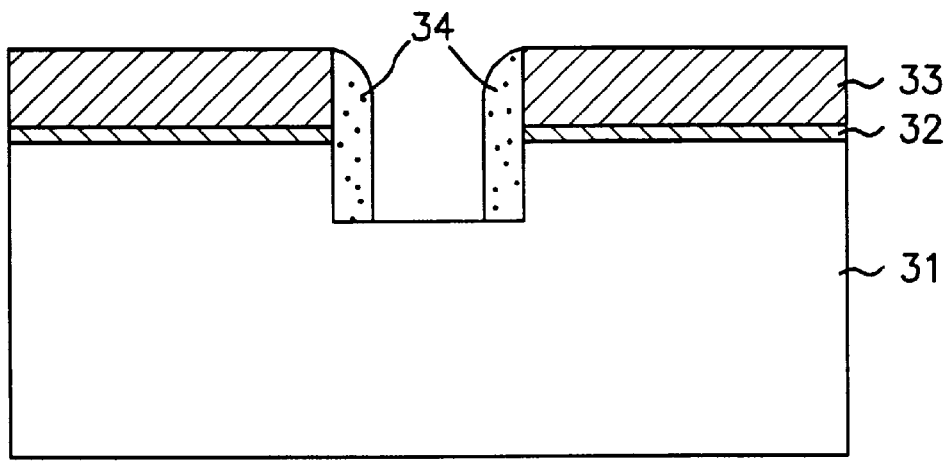
FIGS. 3A to 3C are cross sectional views of a semiconductor device having a shallow trench isolation structure according to an embodiment of the present invention.
Figure 3B:
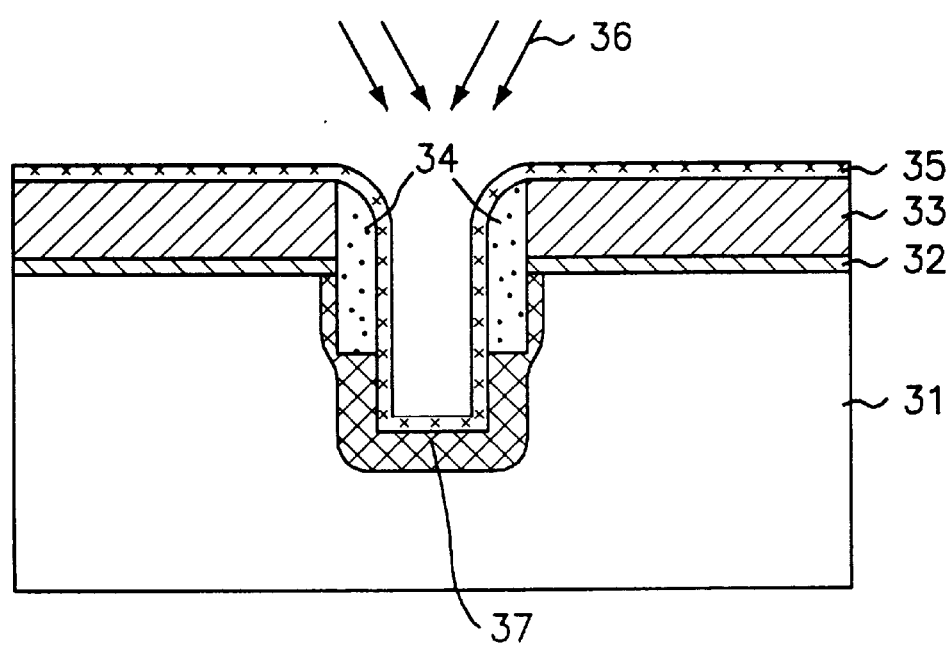
Figure 3C:
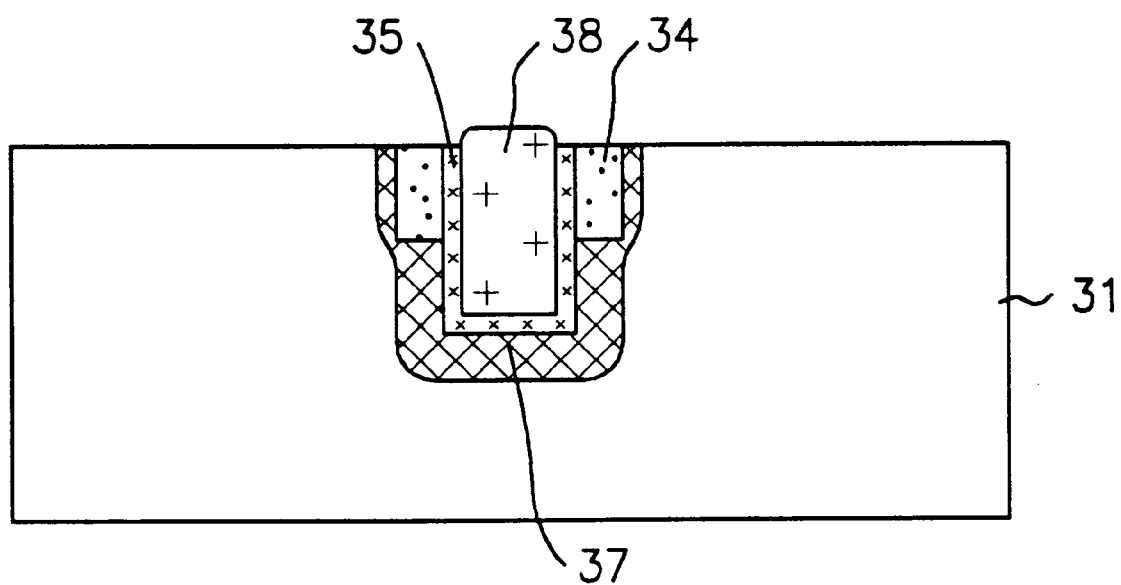

An embodiment according of the present invention will be shown in detail with reference to FIGS. 3A to 3C.

The FIGS. 3A to 3C are cross sectional views of a semiconductor device having a shallow trench isolation structure according to an embodiment of the present invention.

First, referring to FIG. 3A, a pad oxide layer 32, such as silicon oxide layer, and a silicon nitride layer 33 are formed, in order, on a silicon substrate 31, and the silicon nitride layer 33, the pad oxide layer 32 and the silicon substrate 31 are etched selectively so as to form a trench. Thereafter, an insulating layer, such as a silicon oxide layer and a silicon nitride layer, is formed on the resulting structure and etched without an etching mask so that spacer insulation layers 34 are formed on the sidewalls of the trench.

Referring to FIG. 3B, the exposed silicon substrate 31 is etched to form a trench using the silicon nitride layer 33 and spacer insulation layers 34 as an etching mask. Then, a buffer oxide layer 35, such as an oxide layer, is formed in the trench. Thereafter, ions 36 are implanted obliquely into the trench by the channel stop ion implantation process. In the above mentioned ion implantation process, the region near the surface of the silicon substrate 31 is lightly doped, compared with the bottom of the trench, due to spacer insulation layers 34, therefore the narrow width effect is minimized. The regions not covered with spacer insulation layers 34 are highly doped and keep the dopant concentration high, although it is diminished in the thermal treatment process, so that the leakage current problem is prevented.

Referring next to FIG. 3C, to isolate the devices, an insulating layer 38 is formed on the resulting structure and etched by the chemical-mechanical polishing method.

Therefore, the leakage current is prevented due to the sufficient amount of ions in the bottom region of the trench, and the narrow width effect is minimized owing to the spacer insulation layers formed near the silicon substrate surface.

Figure 4A:
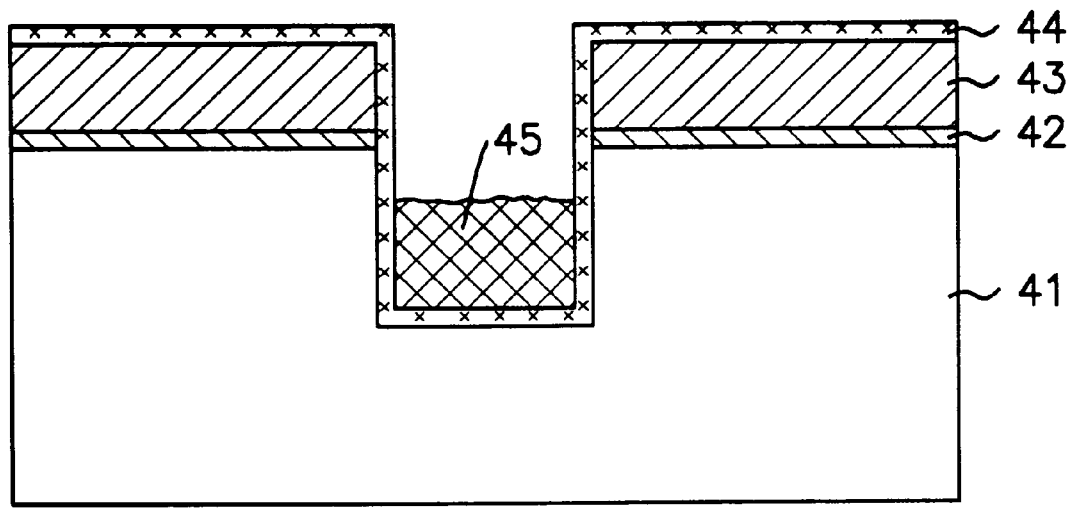
FIGS. 4A and 4B are cross sectional views of a semiconductor device having a shallow trench isolation structure according to another embodiment of the present invention.
Figure 4B:
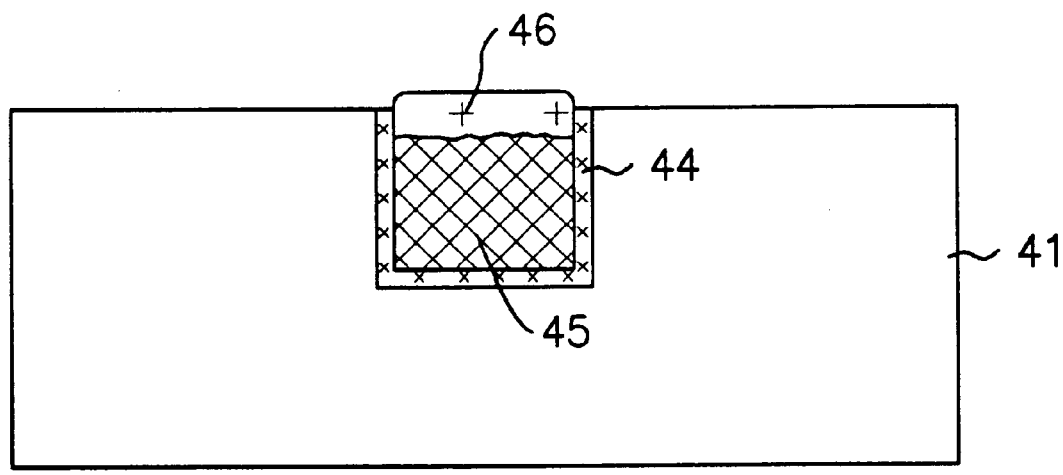

Another embodiment according of the present invention will be shown in detail with reference to FIGS. 4A and 4B.

The FIGS. 4A and 4B, are cross sectional views of a semiconductor device having a shallow trench isolation structure according to another embodiment of the present invention.

First referring to FIG. 4A, a pad oxide layer 42, such as a silicon oxide layer, and a silicon nitride layer 43 are formed, in order, on a silicon substrate 41, and the silicon nitride layer 43, the silicon oxide layer 42 and the silicon substrate 41 are etched selectively so as to form a trench. A buffer oxide layer 44 is formed on the resulting structure. Thereafter, most of the trench is filled with a doped polysilicon 45, which has the similarity with silicon in the impurity solubility characteristic. Herein, the polysilicon layer depositing process and the doping process are carried out simultaneously with the in-situ method.

Referring next to FIG. 4B, an insulating layer 46, such as a silicon oxide layer and a silicon nitride layer, is formed on the resulting structure and is etched by the chemical-mechanical polishing method. Herein, the insulating layer 46 buried in the left region of the trench is thin and therefore, the amount of the flowing dopant from the sidewalls of the silicon substrate to the insulating layer 46 is reduced in the subsequent thermal treatment process.

As mentioned in the above methods, the device characteristics are improved by preventing the narrow width effect, and more particularly the developed method for forming shallow trench isolation structure may contribute to the isolation of highly densed devices, such as 1 giga dynamic random access memory devices.

Although the preferred embodiments of the present invention have been disclosed for illustrative purposes, those skilled in the art will appreciate that various modification, additions and substitutions are possible, without departing from the scope and the spirit of the present invention as disclosed in the accompanying claims.

What is claimed is:

1. A method for fabricating a semiconductor device comprising the steps of:

forming a first recess by etching a semiconductor substrate to a predetermined depth;

forming first insulating layer patterns on sidewalls of said first recess, exposing the bottom of said first recess;

forming a second recess by etching a region not covered with said first insulating layer patterns in said first recess;

forming an ion-doped region in said first and said second recesses by an oblique channel stop ion implantation process; and forming a second insulating layer with which said first and second recesses are fully filled.

2. A method in accordance with claim 1, wherein said step of forming said first insulating layer comprises the steps of:

forming an insulating layer on the semiconductor substrate; and applying an anisotropic etching process to said insulating layer.

3. A method in accordance with claim 1, wherein said method further comprises the step of forming a third insulating layer on the semiconductor substrate including said first and second recesses to prevent said semiconductor substrate from being damaged during said channel stop ion implantation process.

4. A method in accordance with claim 1, wherein said ion-doped region comprises a low concentration doped region near said first recess and a high concentration doped region near said second recess.

5. A method for fabricating a semiconductor device having a shallow trench isolation structure including the steps of:

forming mask patterns on a semiconductor substrate, exposing a portion of said semiconductor substrate;

selectively etching an exposed region of said semiconductor substrate to a predetermined depth so as to form a first recess;

forming ion-implantation buffer layers on sidewalls of said first recess, exposing a bottom of said first recess;

etching said semiconductor substrate using said mask patterns and said ion-implantation buffer layers as an etching mask, thereby forming a second recess;

implanting ions into said semiconductor substrate around said first and second recesses, wherein the ions are implanted obliquely; and forming an insulating layer on the semiconductor substrate and etching back said insulating layer so that said first and second recesses are fully filled with said insulating layer.

6. A method in accordance with claim 5, wherein said method further comprises the step of forming a passivation layer to prevent said semiconductor substrate from being damaged in said ion-implantation process.

7. A method in accordance with claim 5, wherein said mask patterns are made of an oxide layer and a silicon nitride layer deposited, in order, on said semiconductor substrate.

8. A method in accordance with claim 5, wherein said mask patterns are formed by the device isolation masking process and the etching process.

9. A method in accordance with claim 5, wherein said step of forming ion-implantation buffer layer further comprises the steps of:

forming an insulating layer on the semiconductor substrate; and anisotropically etching said insulating layer.

10. A method in accordance with claim 5, wherein said ion-implantation buffer layer is one of, a silicon oxide layer or a silicon nitride layer.

11. A method in accordance with claim 5, wherein said passivation layer is an oxide layer.

12. A method in accordance with claim 5, wherein said etching back process is carried out by a chemical-mechanical polishing method.

13. A method in accordance with claim 1, wherein said second insulating layer is silicon oxide layer.

14. A method in accordance with claim 3, wherein said third insulating layer is silicon oxide layer.

* * * * *